US011217649B2

(12) United States Patent
Lou

(10) Patent No.: US 11,217,649 B2
(45) Date of Patent: Jan. 4, 2022

(54) METHOD OF TESTING AND ANALYZING DISPLAY PANEL

(71) Applicant: STAR TECHNOLOGIES, INC., Hsinchu (TW)

(72) Inventor: Choon Leong Lou, Hsinchu (TW)

(73) Assignee: Star Technologies, Inc., Hsinchu (TW)

( * ) Notice: Subject to any disclaimer, the term of this patent is extended or adjusted under 35 U.S.C. 154(b) by 17 days.

(21) Appl. No.: 16/839,828

(22) Filed: Apr. 3, 2020

(65) Prior Publication Data

US 2021/0313408 A1    Oct. 7, 2021

(51) Int. Cl.
| | | |
|---|---|---|
| *H01L 27/32* | (2006.01) | |
| *G02F 1/1368* | (2006.01) | |
| *H01L 51/56* | (2006.01) | |
| *H01L 21/66* | (2006.01) | |
| *G02F 1/136* | (2006.01) | |

(52) U.S. Cl.
CPC ........ *H01L 27/3265* (2013.01); *G02F 1/1368* (2013.01); *H01L 22/12* (2013.01); *H01L 22/20* (2013.01); *H01L 27/3262* (2013.01); *H01L 51/56* (2013.01); *G02F 1/13606* (2021.01)

(58) Field of Classification Search
None
See application file for complete search history.

(56) References Cited

U.S. PATENT DOCUMENTS

| | | | | |
|---|---|---|---|---|
| 2004/0246019 A1* | 12/2004 | Nakano | ................. | G09G 3/006 324/762.09 |
| 2005/0093567 A1* | 5/2005 | Nara | ...................... | G09G 3/006 324/762.09 |
| 2011/0175885 A1* | 7/2011 | Shirouzu | ............. | H01L 27/3265 345/211 |
| 2014/0312330 A1* | 10/2014 | Chaji | ..................... | G09G 3/006 257/40 |
| 2017/0062490 A1* | 3/2017 | Noh | .................... | H01L 27/1251 |

FOREIGN PATENT DOCUMENTS

CN            105210139 A         12/2015

OTHER PUBLICATIONS

Office action and Search report dated Sep. 27, 2021 from the TIPO counterpart application TW109140384 w/ partial English-language translation, 8 pages.

* cited by examiner

*Primary Examiner* — Erik Kielin
(74) *Attorney, Agent, or Firm* — Muncy, Geissler, Olds & Lowe, P.C.

(57) ABSTRACT

A method for testing and analyzing a display panel, comprising: providing a display panel including a circuitry and a pixel connected to the circuitry, wherein the pixel includes a capacitor, a transistor and an electrode electrically connected to the capacitor and the transistor; measuring a first parameter of the display panel; disabling the pixel; measuring a second parameter of the display panel; and deriving a third parameter of the pixel by subtracting the second parameter from the first parameter.

18 Claims, 3 Drawing Sheets

METHOD OF TESTING AND ANALYZING DISPLAY PANEL

TECHNICAL FIELD

The present disclosure relates to a method of analyzing a display panel, and particularly relates to a method of deriving a parameter related to one or more components in the display panel. Further, the present disclosure relates to a method of manufacturing a display panel, and particularly relates to a method of manufacturing several display panels including analysis of one or more display panels.

DISCUSSION OF THE BACKGROUND

Upon or after fabrication of a display panel (such as a liquid crystal display (LCD) panel, thin-film transistor (TFT) LCD panel or organic light-emitting diode (OLED) panel) the display panel is tested by a probing device such as a probe card. With the advancement of electronic technology, the display panel includes large numbers of semiconductive components such as transistors, capacitors, etc. having very small scale and providing advanced functionality. As a result, as the technology continues to advance, the testing of the display panel becomes increasingly complicated. It is required to test the display panel very quickly in order to keep the testing duration to a minimum.

Since parameters (such as capacitance, electrical current, etc.) related to the components in the display panel are of a very small scale, it is difficult or impossible to measure such parameters directly within a short period of time. Conventionally, the parameters are obtained based on simulation or computation. However, the accuracy of simulation is low (e.g., 50% or less) because variation during fabrication of the components of the display panel may significantly reduce the accuracy of simulation.

The variations from fabrication are unavoidable. Therefore, the parameters related to the components in the display panel cannot be accurately obtained by simulation. The simulation parameters will vary from the actual parameters due to process deviations, which will affect the interpretation and analysis of the final test results. Therefore, it is more accurate to actually measure individual parameters and extract individual data. Accordingly, there is a continuous need to improve the accuracy with which the parameters of the components in the display panel are derived.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of analyzing a display panel. The method includes providing a display panel including a circuitry and a pixel connected to the circuitry, wherein the pixel includes a capacitor, a transistor and an electrode electrically connected to the capacitor and the transistor; measuring a first parameter of the display panel; disabling the pixel; measuring a second parameter of the display panel; and deriving a third parameter of the pixel by subtracting the second parameter from the first parameter.

In some embodiments, the disabling of the pixel is performed prior to the measurement of the second parameter of the display panel.

In some embodiments, the pixel is disabled by disconnecting the pixel from the circuitry or by cutting off the electrode of the pixel.

In some embodiments, the pixel is disabled by forming the electrode of the pixel through a photomask with a predetermined pattern.

In some embodiments, the first parameter includes a parasitic capacitance of the circuitry and a capacitance of the capacitor of the pixel.

In some embodiments, the second parameter includes a parasitic capacitance of the circuitry.

In some embodiments, the method further includes transmitting an electrical signal to the display panel before or during the measurement of the first parameter and the measurement of the second parameter.

In some embodiments, the electrical signal is transmitted from a probe of a probe card to the display panel.

In some embodiments, the first parameter includes a parasitic capacitance of the circuitry, a parasitic capacitance of the probe card and a capacitance of the capacitor of the pixel.

In some embodiments, the capacitor of the pixel has a parameter in a femto farad (fF) scale.

In some embodiments, the display panel is a thin film transistor-liquid crystal display (TFT-LCD) panel, LCD panel or organic light-emitting diode (OLED) panel.

In some embodiments, the transistor is a thin-film transistor (TFT), and the capacitor is configured for storing and discharging electrical energy.

Another aspect of the present disclosure provides a method of manufacturing a plurality of display panels. The method includes fabricating a first display panel including a first circuitry and a first pixel connected to the first circuitry, wherein the first pixel includes a first capacitor and a first electrode electrically connected to the first capacitor; fabricating a second display panel including a second circuitry and a second pixel connected to the second circuitry, wherein the second pixel includes a second capacitor and a second electrode electrically connected to the second capacitor; transmitting an electrical signal to the first display panel; measuring a first parameter of the first display panel; transmitting the electrical signal to the second display panel; measuring a second parameter of the second display panel; and deriving a third parameter of the first pixel or the second pixel by subtracting the second parameter from the first parameter, wherein the fabrication of the second display panel includes disabling the second pixel.

In some embodiments, the measurement of the second parameter is performed after the disabling of the second pixel.

In some embodiments, the fabrication of the second display panel includes cutting off the second electrode by laser.

In some embodiments, the fabrication of the second display panel includes placing a photomask with a predetermined pattern over the second display panel; or removing a portion of the second electrode exposed through the photomask.

In some embodiments, the first parameter is substantially greater than the second parameter and the third parameter.

In some embodiments, the first electrode and the second electrode include indium tin oxide (ITO).

In some embodiments, the first pixel includes a plurality of first pixel units arranged in an array over the first display panel, and the second pixel includes a plurality of second pixel units arranged in an array over the second display panel.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
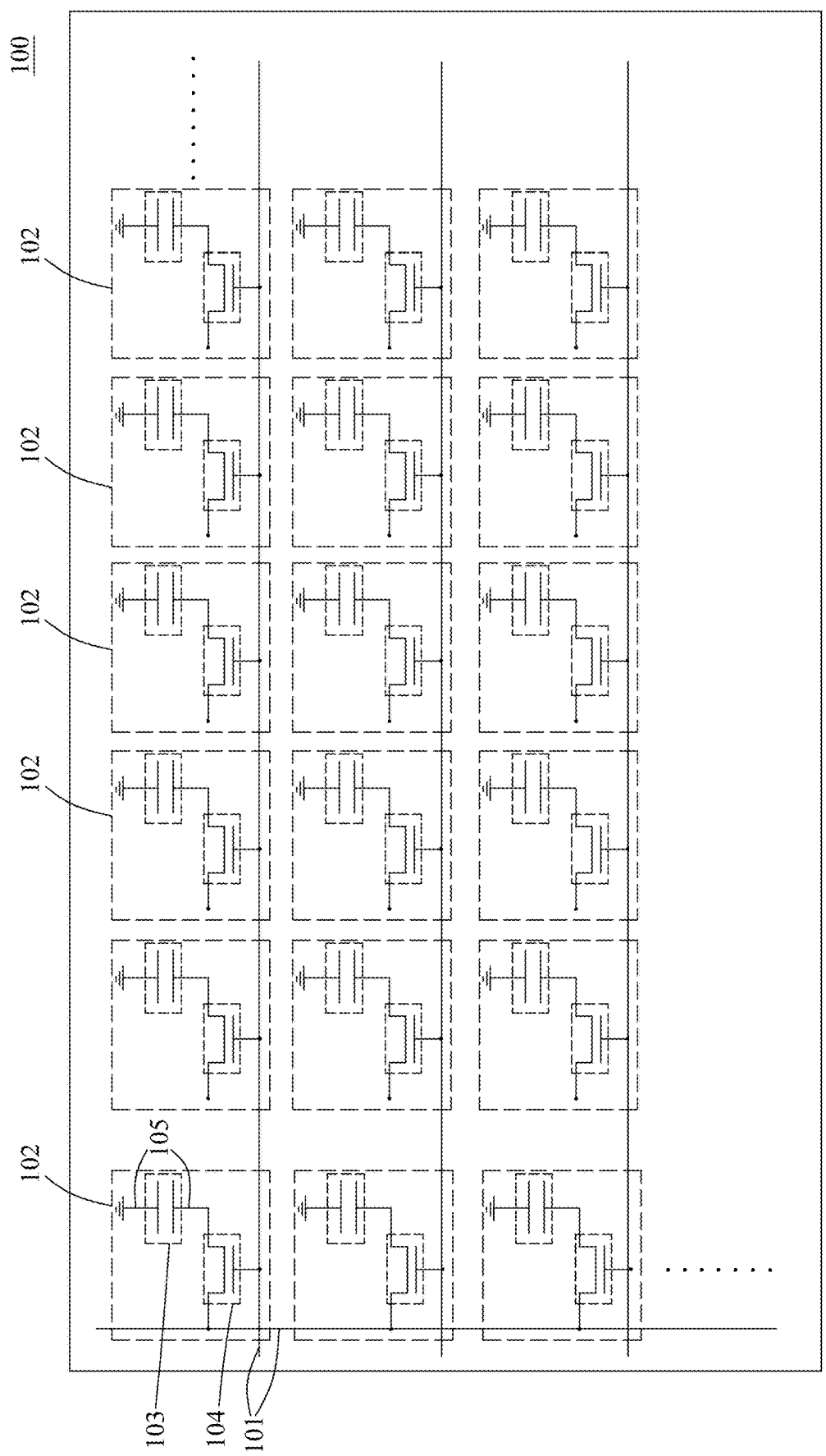
FIG. 1 is a schematic top view of a display panel in accordance with some embodiments of the present disclosure.

FIG. 1 is a top view of a display panel 100 in accordance with various embodiments of the present disclosure. In some embodiments, the display panel 100 includes several pixels 102 arranged in matrix or array as shown in FIG. 1. In some embodiments, each pixel 102 can be driven by a driver IC disposed around a periphery of the display panel 100. Since a distance between one pixel 102 and its corresponding driver IC is different from a distance between another pixel 102 and its corresponding driver IC, parameters of one pixel 102 may be different from parameters measured for another pixel 102. For example, a longer the distance, a higher resistance because of longer length of wirings. However, such difference would not be considered during simulation of electrical testing for the display panel 100. For example, such difference would adversely affect the accuracy of mura defects detection. Therefore, accuracy of the testing result is in concern. In the present disclosure, a method of analyzing a display panel is disclosed. The method includes providing a display panel including a circuitry and a pixel connected to the circuitry, measuring a first parameter of the display panel, disabling the pixel, measuring a second parameter of the pixel after the disabling of the pixel, and deriving a third parameter of the pixel by subtracting the second parameter from the first parameter. Since the parameters of the display panel are measured directly from the display panel, accuracy of the measurement would be improved or increased (e.g., compared to the accuracy of the measurement obtained by simulation). As a result, reliability of the display panel can also be improved.

Figure 2:
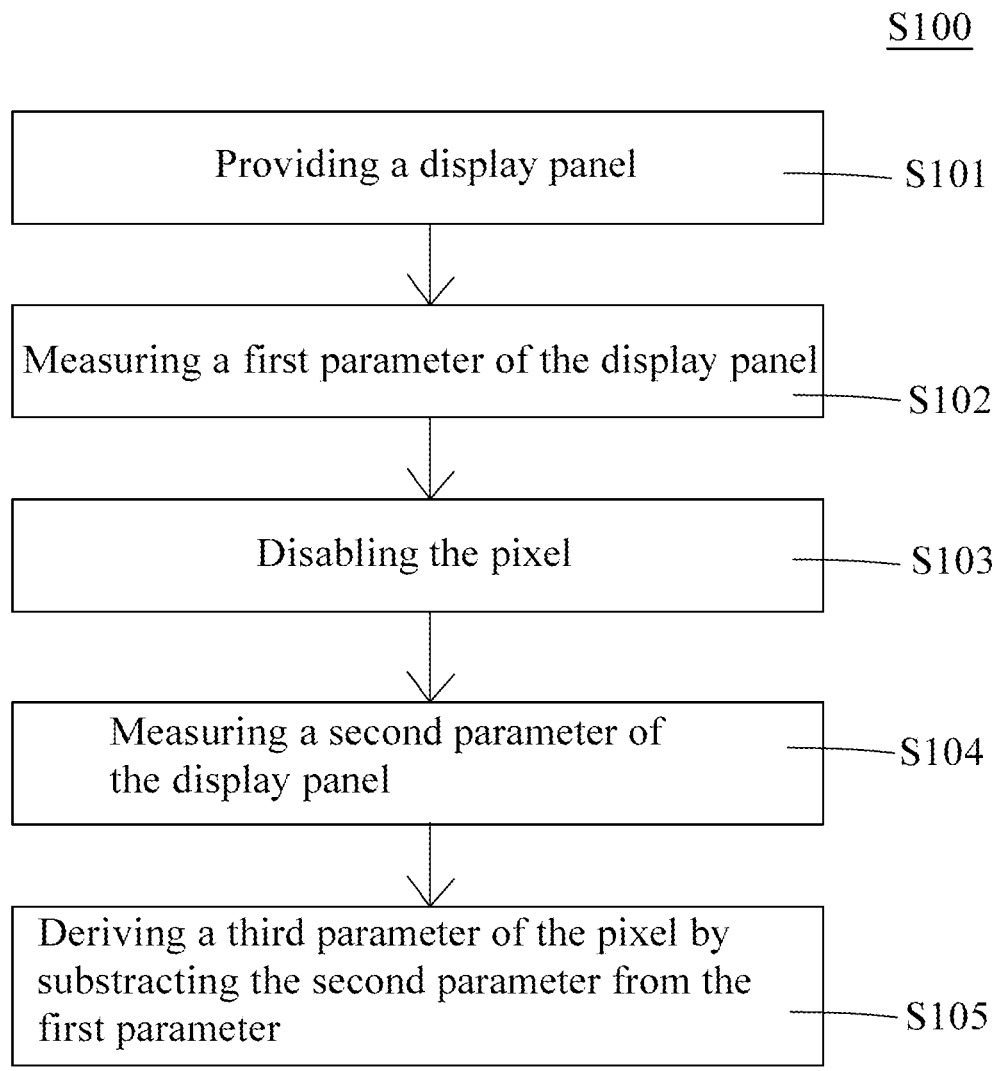
FIG. 2 is a flowchart representing a method of analyzing a display panel according to aspects of the present disclosure in one or more embodiments.

FIG. 2 is a flowchart depicting an embodiment of a method S100 of analyzing the display panel 100. The method S100 includes steps S101, S102, S103, S104 and S105. In some embodiments, the steps S101, S102, S103, S104 and S105 are implemented during or after fabrication of the display panel 100.

In step S101, the display panel 100 is provided. In some embodiments, the display panel 100 is a panel configured to emit light or electromagnetic radiation of a predetermined wavelength. In some embodiments, the display panel 100 is a flat panel with a small thickness. In some embodiments, the display panel 100 can be a thin film transistor-liquid crystal display (TFT-LCD) panel, an LCD panel, an organic light-emitting diode (OLED) panel, or the like.

In some embodiments, the display panel 100 includes a circuitry 101 and a pixel 102 connected to the circuitry 101. In some embodiments, the display panel 100 includes several pixels 102 arranged in an array or matrix. The pixels 102 are repeatedly arranged in the display panel 100. In some embodiments, the circuitry 101 includes several conductive lines and several electrical components connected by the conductive lines. In some embodiments, the circuitry 101 is configured to control one or more pixels 102.

In some embodiments, the pixel 102 includes a capacitor 103, a transistor 104 and an electrode 105 electrically connected to the capacitor 103 and the transistor 104. In some embodiments, the capacitor 103 is a storage capacitor configured to store electrical energy under application of a predetermined voltage. In some embodiments, the capacitor 103 is configured to discharge electrical energy stored within the capacitor 103. In some embodiments, the capacitor 103 has a capacitance that is of a femto farad (fF) scale, which is a very small scale. In some embodiments, the transistor 104 is electrically connected to the circuitry 101.

In some embodiments, the transistor 104 can be a thin-film transistor (TFT), a transistor comprising a glass substrate, or the like. In some embodiments, the transistor 104 serves as a switch for the pixel 102. In some embodiments, the transistor 104 is configured to control state(s) of the pixel 102 rapidly to turn the pixel 102 on or off at a high speed.

In some embodiments, the electrode 105 of the pixel 102 includes transparent material such as indium tin oxide (ITO). In some embodiments, the pixel 102 includes a pair of electrodes 105 disposed opposite to each other. In some embodiments, the pair of electrodes 105 includes a pixel electrode and a common electrode. The pixel electrode is electrically connected to the transistor 104, and the common electrode is electrically connected to ground. In some embodiments, a liquid crystal is disposed between the pixel electrode and the common electrode. A data signal can be transmitted to the pixel electrode through the transistor 104, and a voltage difference between the pixel electrode and the common electrode creates an electric field through the liquid crystal to change a light-transmitting property of the pixel 102.

In step S102, a first parameter of the display panel 100 is measured. In some embodiments, the first parameter of the display panel 100 is obtained during an intermediate stage of fabrication of the display panel 100 or after the fabrication of the display panel 100. In some embodiments, the first parameter can be any measurable parameter related to the display panel 100, such as capacitance, electric current, resistance, leakage current, etc. In some embodiments, the first parameter includes a parasitic capacitance of the circuitry 101 and a capacitance of the capacitor 103 of the pixel 102. In some embodiments, the first parameter includes a parasitic capacitance of the circuitry 101, a parasitic capacitance of a probe card for testing the display panel 100 and a capacitance of the capacitor 103 of the pixel 102.

In some embodiments, an electrical signal is transmitted to the display panel 100 before or during the measurement of the first parameter. In some embodiments, the electrical signal is transmitted from a probe of a probe card to the display panel 100. In some embodiments, an output signal is transmitted from the circuitry 101 of the display panel 100 to the probe of the probe card.

In step S103, the pixel 102 is disabled. In some embodiments, the pixel 102 is disabled after the measurement of the first parameter. In some embodiments, the disabling of the pixel 102 is implemented during an intermediate stage of the fabrication of the display panel 100 or after the fabrication of the display panel 100. In some embodiments, the pixel 102 can be disabled by disconnecting the pixel 102 from the circuitry 101 of the display panel 100. In some embodiments, the disconnection of the pixel 102 can be implemented by cutting off the electrode 105 of the pixel 102. In some embodiments, the electrode 105 of the pixel 102 is cut by laser or any other suitable means. In some embodiments, the pixel 102 can be disabled by forming the electrode 105 of the pixel 102 through a photomask in a predetermined pattern during the fabrication of the display panel 100. In some embodiments, the disconnection of the pixel 102 can be implemented by bridging electrodes 105 of the pixel 102 (short circuit).

In step S104, a second parameter of the display panel 100 is measured. In some embodiments, the second parameter of the display panel 100 is obtained during an intermediate stage of fabrication of the display panel 100 or after the fabrication of the display panel 100. In some embodiments, the disabling of the pixel 102 is performed prior to the measurement of the second parameter of the display panel 100.

In some embodiments, the second parameter can be any measurable parameter related to the display panel 100, such as capacitance, electric current, resistance, leakage current, etc. In some embodiments, the second parameter and the first parameter reflect the same kind of physical property of the display panel 100. For example, if the first parameter is a capacitance of the display panel 100, the second parameter is also a capacitance of the display panel 100 when the pixel 102 is disabled.

In some embodiments, the second parameter includes the parasitic capacitance of the circuitry 101. In some embodiments, the second parameter includes the parasitic capacitance of the circuitry 101 and the parasitic capacitance of a probe card for testing the display panel 100. Since the pixel 102 is disabled before or during the measurement of the second parameter, one or more parameters of the pixel 102 are excluded.

In some embodiments, an electrical signal is transmitted to the display panel 100 before or during the measurement of the second parameter. In some embodiments, the electrical signal is transmitted from a probe of a probe card to the display panel 100. In some embodiments, an output signal is transmitted from the circuitry 101 of the display panel 100 to the probe of the probe card.

In step S105, a third parameter of the pixel 102 is derived based on the first parameter and the second parameter. In some embodiments, the third parameter is derived by subtracting the second parameter from the first parameter. In some embodiments, the third parameter is an offset of the second parameter from the first parameter. In some embodiments, the third parameter is a capacitance of the pixel 102. In some embodiments, the third parameter is a capacitance of the capacitor 103 of the pixel 102.

After the measurement of the first parameter and the second parameter, the third parameter is obtained based on calculation. For example, the first parameter is a total capacitance of the display panel 100, the second parameter is a capacitance of the display panel 100 without a capacitance of the pixel 102, and therefore the capacitance of the pixel 102 can be derived by subtracting the capacitance of the display panel 100 without the capacitance of the pixel 102 from the total capacitance of the display panel 100. Since the third parameter of the pixel 102 is derived based on direct measurements of the first parameter and the second parameter, accuracy of the third parameter is improved (e.g., compared to that obtained by simulation result). Further, parasitic parameters of other electrical components/devices (such as tester, cables, probing unit, probes or the like) electrically connected to the display panel 100 are also included during the direct measurements, while those parasitic parameters would not be included during simulation. As such, the result obtained by the direct measurement is more accurate than the result obtained by simulation. After the performance of the method S100, the display panels 100 can be massively produced based on the accurate measurement by the method S100.

Figure 3:
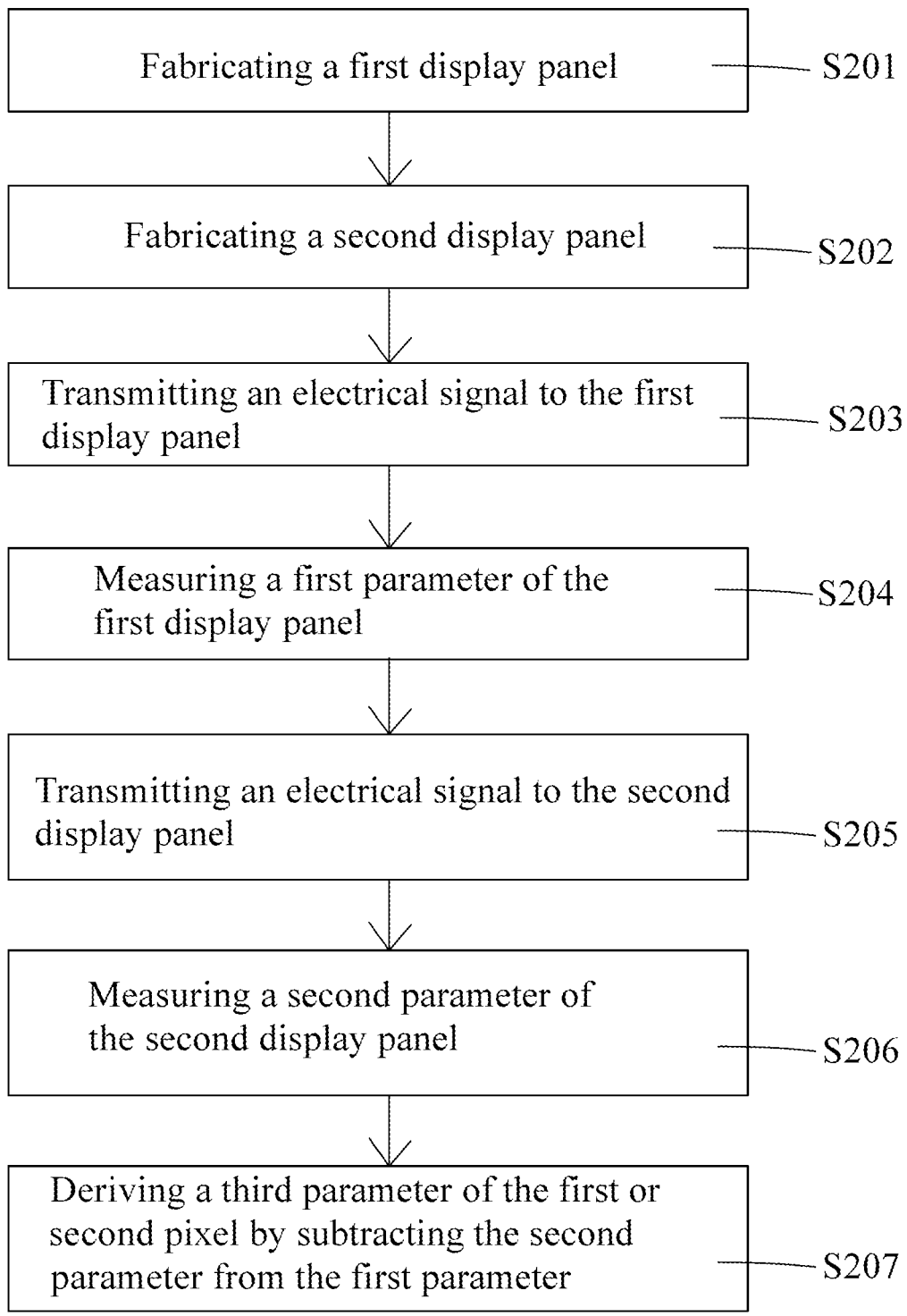
FIG. 3 is a flowchart representing a method of manufacturing several display panels according to aspects of the present disclosure in one or more embodiments.

FIG. 3 is a flowchart depicting an embodiment of a method S200 of manufacturing a plurality of display panels 100. In some embodiments, the method S200 is part of the manufacturing of several display panels 100. The method S200 includes steps S201, S202, S203, S204, S205, S206 and S207. In some embodiments, the steps S201, S202, S203, S204, S205, S206 and S207 are some of manufacturing steps of several display panels 100.

In step S201, a first display panel is fabricated or provided. In some embodiments, the first display panel is same as the display panel 100 as described above or shown in FIG. 1. In some embodiments, the first display panel includes a first circuitry and a first pixel connected to the first circuitry. In some embodiments, the first circuitry is same as the circuitry 101 as described above or shown in FIG. 1. In some embodiments, the first pixel is same as the pixel 102 as described above or shown in FIG. 1. In some embodiments, the first pixel includes a first capacitor, a first transistor and a first electrode electrically connected to the first capacitor and the first transistor. In some embodiments, the first capacitor, the first transistor and the first electrode are same as the capacitor 103, the transistor 104 and the electrode 105 respectively as described above or shown in FIG. 1

In step S202, a second display panel is fabricated or provided. In some embodiments, the second display panel is same as the display panel 100 as described above or shown in FIG. 1. In some embodiments, the second display panel is similar to the first display panel fabricated or provided in step S201. In some embodiments, the first display panel and the second display panel are from the same manufacturing batch.

In some embodiments, the fabrication of the second display panel includes disabling the second pixel. In some embodiments, the disabling of the second pixel is implemented during an intermediate stage of the fabrication of the second display panel or after the fabrication of the second display panel. In some embodiments, the second pixel can be disabled by disconnecting the second pixel from the second circuitry of the second display panel. In some embodiments, the disconnection of the second pixel can be implemented by cutting off the second electrode of the second pixel. In some embodiments, the second electrode of the second pixel is cut by laser or any other suitable means. In some embodiments, the second pixel can be disabled by forming the second electrode of the second pixel through a photomask in a predetermined pattern during the fabrication of the second display panel. In some embodiments, the disabling of the second pixel is implemented by placing a photomask with a predetermined pattern over the second display panel, and then removing a portion of the second electrode that is exposed through the photomask. In some embodiments, the disabling of the second pixel is implemented by photolithography and etching.

In step S203, an electrical signal is transmitted to the first display panel. In some embodiments, the electrical signal is transmitted from a probe of a probe card to the first display panel. In some embodiments, an output signal is transmitted from the first circuitry of the first display panel to the probe of the probe card.

In step S204, a first parameter of the first display panel is measured. In some embodiments, the first parameter of the first display panel is obtained during an intermediate stage of fabrication of the first display panel or after the fabrication of the first display panel. In some embodiments, the first parameter can be any measurable parameter related to the first display panel, such as capacitance, electric current, resistance, leakage current, etc. In some embodiments, the first parameter includes a parasitic capacitance of the first circuitry and a capacitance of the first capacitor of the first pixel. In some embodiments, the first parameter includes a parasitic capacitance of the first circuitry, a parasitic capacitance of a probe card for testing the first display panel, and a capacitance of the capacitor of the first pixel.

In step S205, an electrical signal is transmitted to the second display panel. In some embodiments, the electrical signal is transmitted from a probe of a probe card to the second display panel. In some embodiments, an output signal is transmitted from the second circuitry of the second display panel to the probe of the probe card. In some embodiments, the second pixel is disabled before the transmission of the electrical signal to the second display panel, i.e., before the step 205 is executed.

In step S206, a second parameter of the second display panel is measured. In some embodiments, the second parameter of the second display panel is obtained during an intermediate stage of fabrication of the second display panel or after the fabrication of the second display panel. In some embodiments, the second pixel is disabled prior to the measurement of the second parameter of the second display panel, i.e., before step S206 is executed. The measurement of the second parameter is performed after the disabling of the second pixel.

In some embodiments, the second parameter can be any measurable parameter related to the second display panel, such as capacitance, electric current, resistance, leakage current, etc. In some embodiments, the second parameter and the first parameter reflect the same kind of physical property of the first and second display panels. For example, if the first parameter is a capacitance of the first display panel, the second parameter is a capacitance of the second display panel when the second pixel is disabled.

In some embodiments, the second parameter includes the parasitic capacitance of the second circuitry. In some embodiments, the second parameter includes the parasitic capacitance of the second circuitry and the parasitic capacitance of a probe card for testing the second display panel. Since the second pixel is disabled before or during the measurement of the second parameter, one or more parameters of the second pixel are excluded. In some embodiments, the first parameter is substantially greater than the second parameter.

In step S207, a third parameter is derived. In some embodiments, the third parameter is related to the first pixel or the second pixel. In some embodiments, the third parameter is derived by subtracting the second parameter from the first parameter. In some embodiments, the third parameter is an offset of the second parameter from the first parameter. In some embodiments, the first parameter is substantially greater than the second parameter and the third parameter.

In some embodiments, the third parameter is a capacitance of the first pixel or a capacitance of the second pixel. After the measurement of the first parameter and the second parameter, the third parameter is obtained based on calculation. For example, the first parameter is a total capacitance of the first display panel, the second parameter is a total capacitance of the second display panel without a capacitance of the second pixel, and therefore the capacitance of the second pixel can be derived by subtracting the total capacitance of the second display panel without the capacitance of the second pixel from the total capacitance of the first display panel. In some embodiments, since the first display panel and the second display panel are from the same manufacturing batch, configuration of the second pixel is substantially same as the configuration of the first pixel. As such, the capacitance of the second pixel is substantially equal to the capacitance of the first pixel. Since the third parameter of the pixel is derived based on direct measurements of the first parameter and the second parameter, accuracy of the third parameter is improved (e.g., compared to that obtained by simulation result).

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of analyzing a display panel, comprising:
    providing a display panel including a circuitry and a pixel connected to the circuitry, wherein the pixel includes a capacitor, a transistor and an electrode electrically connected to the capacitor and the transistor;
    measuring a first parameter of the display panel;
    disabling the pixel;
    measuring a second parameter of the display panel, wherein the first parameter includes a parasitic capacitance of the circuitry and a capacitance of the capacitor of the pixel; and
    deriving a third parameter of the pixel by subtracting the second parameter from the first parameter.

2. The method of claim 1, wherein the disabling of the pixel is performed prior to the measuring of the second parameter of the display panel.

3. The method of claim 1, wherein the pixel is disabled by disconnecting the pixel from the circuitry or cutting off the electrode of the pixel.

4. The method of claim 1, wherein the pixel is disabled by forming the electrode of the pixel through a photomask in a predetermined pattern.

5. The method of claim 1, wherein the second parameter includes a parasitic capacitance of the circuitry.

6. The method of claim 1, further comprising transmitting an electrical signal to the display panel before or during the measuring of the first parameter and the measuring of the second parameter.

7. The method of claim 6, wherein the electrical signal is transmitted from a probe of a probe card to the display panel.

8. The method of claim 7, wherein the first parameter includes a parasitic capacitance of the probe card.

9. The method of claim 1, wherein the capacitor of the pixel has a capacitance that is of a femto farad (fF) scale.

10. The method of claim 1, wherein the display panel is a thin film transistor-liquid crystal display (TFT-LCD) panel, an LCD panel, or an organic light-emitting diode (OLED) panel.

11. The method of claim 1, wherein the transistor is a thin-film transistor (TFT), and the capacitor is configured for storing and discharging electrical energy.

12. A method of manufacturing a plurality of display panels, comprising:
    fabricating a first display panel including a first circuitry and a first pixel connected to the first circuitry, wherein the first pixel includes a first capacitor and a first electrode electrically connected to the first capacitor;
    fabricating a second display panel including a second circuitry and a second pixel connected to the second circuitry, wherein the second pixel includes a second capacitor and a second electrode electrically connected to the second capacitor;
    transmitting an electrical signal to the first display panel;
    measuring a first parameter of the first display panel;
    transmitting the electrical signal to the second display panel;
    measuring a second parameter of the second display panel; and
    deriving a third parameter of the first pixel or the second pixel by subtracting the second parameter from the first parameter,
    wherein the fabricating of the second display panel includes disabling the second pixel.

13. The method of claim 12, wherein the measuring of the second parameter is performed after the disabling of the second pixel.

14. The method of claim 12, wherein the fabricating of the second display panel includes cutting off the second electrode by laser.

15. The method of claim 12, wherein the fabricating of the second display panel includes:
    placing a photomask with a predetermined pattern over the second display panel; and
    removing a portion of the second electrode exposed through the photomask.

16. The method of claim 12, wherein the first parameter is substantially greater than the second parameter and the third parameter.

17. The method of claim 12, wherein the first electrode and the second electrode include indium tin oxide (ITO).

18. The method of claim 12, wherein the first pixel includes a plurality of first pixel units arranged in an array over the first display panel, or the second pixel includes a plurality of second pixel units arranged in an array over the second display panel.

* * * * *